United States Patent
Ahn et al.

(10) Patent No.: US 7,064,058 B2
(45) Date of Patent: *Jun. 20, 2006

(54) LOW-TEMPERATURE GROWTH HIGH-QUALITY ULTRA-THIN PRASEODYMIUM GATE DIELETRICS

(75) Inventors: Kie Y. Ahn, Chappaqua, NY (US); Leonard Forbes, Corvallis, OR (US)

(73) Assignee: Micron Technology, Inc., Boise, ID (US)

(*) Notice: Subject to any disclaimer, the term of this patent is extended or adjusted under 35 U.S.C. 154(b) by 114 days.

This patent is subject to a terminal disclaimer.

(21) Appl. No.: 10/768,597

(22) Filed: Jan. 30, 2004

(65) Prior Publication Data

US 2004/0185654 A1 Sep. 23, 2004

Related U.S. Application Data

(63) Continuation of application No. 10/027,315, filed on Dec. 20, 2001, now Pat. No. 6,900,122.

(51) Int. Cl.
H01L 21/4763 (2006.01)
(52) U.S. Cl. ..................................... 438/635
(58) Field of Classification Search ................. 438/635
See application file for complete search history.

(56) References Cited

U.S. PATENT DOCUMENTS

| | | | |
|---|---|---|---|
| 4,058,430 A | 11/1977 | Suntola et al. | |
| 4,215,156 A | 7/1980 | Dalal et al. | 427/84 |
| 4,333,808 A | 6/1982 | Bhattacharyya et al. | 204/192 D |
| 4,399,424 A | 8/1983 | Rigby | 338/34 |
| 4,647,947 A | 3/1987 | Takeoka et al. | 346/135.1 |
| 4,767,641 A | 8/1988 | Kieser et al. | 427/38 |
| 4,920,071 A | 4/1990 | Thomas | 437/188 |
| 5,625,233 A | 4/1997 | Cabral, Jr. et al. | |
| 5,698,022 A | 12/1997 | Glassman et al. | |
| 5,751,021 A | 5/1998 | Teraguchi | |
| 5,795,808 A | 8/1998 | Park | 438/301 |
| 5,801,105 A | 9/1998 | Yano et al. | 438/785 |
| 5,810,923 A | 9/1998 | Yano et al. | 117/84 |
| 5,822,256 A | 10/1998 | Bauer et al. | 365/200 |
| 5,828,080 A | 10/1998 | Yano et al. | 257/43 |

(Continued)

FOREIGN PATENT DOCUMENTS

EP 0540993 A1 5/1993

(Continued)

OTHER PUBLICATIONS

Technical publication by CERAC about praseodymium Oxide, http://www.cerac.com/pubs/proddata/pr2o3.htm.*

(Continued)

*Primary Examiner*—Asok Kumar Sarkar
(74) *Attorney, Agent, or Firm*—Schwegman, Lundberg, Woessner & Kluth, P.A.

(57) ABSTRACT

A praseodymium (Pr) gate oxide and method of fabricating same that produces a high-quality and ultra-thin equivalent oxide thickness as compared to conventional $SiO_2$ gate oxides are provided. The Pr gate oxide is thermodynamically stable so that the oxide reacts minimally with a silicon substrate or other structures during any later high temperature processing stages. The process shown is performed at lower temperatures than the prior art, which further inhibits reactions with the silicon substrate or other structures. Using a thermal evaporation technique to deposit a Pr layer to be oxidized, the underlying substrate surface smoothness is preserved, thus providing improved and more consistent electrical properties in the resulting gate oxide.

65 Claims, 6 Drawing Sheets

U.S. PATENT DOCUMENTS

| | | | |
|---|---|---|---|
| 5,840,897 A | 11/1998 | Kirlin et al. ............... 546/2 |
| 5,912,797 A | 6/1999 | Schneemeyer et al. |
| 6,010,969 A | 1/2000 | Vaartstra |
| 6,013,553 A | 1/2000 | Wallace et al. ............. 438/287 |
| 6,020,024 A | 2/2000 | Maiti et al. .............. 427/248.1 |
| 6,025,627 A | 2/2000 | Forbes et al. |
| 6,027,961 A | 2/2000 | Maiti et al. ................ 438/199 |
| 6,154,280 A | 11/2000 | Borden |
| 6,171,900 B1 | 1/2001 | Sun ............................ 438/240 |
| 6,211,035 B1 | 4/2001 | Moise et al. ................ 438/396 |
| 6,217,645 B1 | 4/2001 | Vaartstra |
| 6,225,168 B1 | 5/2001 | Gardner et al. ............ 438/287 |
| 6,225,237 B1 | 5/2001 | Vaartstra |
| 6,258,637 B1 | 7/2001 | Wilk et al. |
| 6,273,951 B1 | 8/2001 | Vaartstra |
| 6,294,813 B1 | 9/2001 | Forbes et al. |
| 6,297,539 B1 | 10/2001 | Ma et al. .................... 257/410 |
| 6,300,203 B1 | 10/2001 | Buynoski et al. |
| 6,303,481 B1 | 10/2001 | Park ............................ 438/591 |
| 6,331,465 B1 | 12/2001 | Forbes et al. |
| 6,368,941 B1 | 4/2002 | Chen et al. ................. 438/424 |
| 6,381,168 B1 | 4/2002 | Forbes |
| 6,387,712 B1 | 5/2002 | Yano et al. ..................... 438/3 |
| 6,391,769 B1 | 5/2002 | Lee et al. .................... 438/643 |
| 6,404,027 B1 | 6/2002 | Hong et al. |
| 6,429,065 B1 | 8/2002 | Forbes |
| 6,441,417 B1 | 8/2002 | Zhang et al. |
| 6,444,592 B1 | 9/2002 | Ballantine et al. |
| 6,448,192 B1 | 9/2002 | Kaushik ...................... 438/785 |
| 6,451,662 B1 | 9/2002 | Chudzik et al. |
| 6,458,701 B1 | 10/2002 | Chae et al. ................. 438/680 |
| 6,461,914 B1 | 10/2002 | Roberts et al. |
| 6,465,334 B1 | 10/2002 | Buynoski et al. ........... 438/591 |
| 6,495,436 B1 | 12/2002 | Ahn et al. ................... 438/591 |
| 6,498,063 B1 | 12/2002 | Ping |
| 6,514,828 B1 | 2/2003 | Ahn et al. ................... 438/297 |
| 6,521,911 B1 | 2/2003 | Parsons et al. ................ 257/52 |
| 6,526,191 B1 | 2/2003 | Geusic et al. |
| 6,527,866 B1 | 3/2003 | Matijasevic et al. |
| 6,531,354 B1 | 3/2003 | Maria et al. |
| 6,534,420 B1 | 3/2003 | Ahn et al. ................... 438/768 |
| 6,537,613 B1 | 3/2003 | Senzaki et al. |
| 6,541,079 B1 | 4/2003 | Bojarczuk, Jr. et al. |
| 6,544,875 B1 | 4/2003 | Wilk |
| 6,551,929 B1 | 4/2003 | Kori et al. |
| 6,573,199 B1 | 6/2003 | Sandhu et al. |
| 6,586,792 B1 | 7/2003 | Ahn et al. |
| 6,590,252 B1 | 7/2003 | Kutsunai et al. |
| 6,592,942 B1 | 7/2003 | Van Wijck |
| 6,593,610 B1 | 7/2003 | Gonzalez |
| 6,608,378 B1 | 8/2003 | Ahn et al. |
| 6,613,702 B1 | 9/2003 | Sandhu et al. |
| 6,627,503 B1 | 9/2003 | Ma et al. |
| 6,632,279 B1 | 10/2003 | Ritala et al. |
| 6,638,859 B1 | 10/2003 | Sneh et al. |
| 6,639,267 B1 | 10/2003 | Eldridge |
| 6,518,634 B1 | 11/2003 | Kaushik et al. |
| 6,652,924 B1 | 11/2003 | Sherman |
| 6,653,209 B1 | 11/2003 | Yamagata |
| 6,660,660 B1 | 12/2003 | Haukka et al. |
| 6,661,058 B1 | 12/2003 | Ahn et al. |
| 6,683,005 B1 | 1/2004 | Sandhu et al. |
| 6,699,747 B1 | 3/2004 | Ruff et al. |
| 6,709,989 B1 | 3/2004 | Ramdani et al. |
| 6,713,846 B1 | 3/2004 | Senzaki |
| 6,730,575 B1 | 5/2004 | Eldridge |
| 6,767,795 B1 | 7/2004 | Ahn et al. |
| 6,768,175 B1 | 7/2004 | Morishita et al. |
| 6,777,353 B1 | 8/2004 | Putkonen |
| 6,780,704 B1 | 8/2004 | Raaijmakers et al. |
| 6,787,413 B1 | 9/2004 | Ahn |
| 6,790,791 B1 | 9/2004 | Ahn et al. |
| 6,812,100 B1 | 11/2004 | Ahn et al. |
| 6,821,862 B1 | 11/2004 | Cho |
| 6,831,315 B1 | 12/2004 | Raaijmakers et al. |
| 6,844,203 B1 | 1/2005 | Ahn et al. |
| 6,844,260 B1 | 1/2005 | Sarigiannis et al. |
| 6,884,739 B1 | 4/2005 | Ahn et al. |
| 6,893,984 B1 | 5/2005 | Ahn et al. |
| 6,900,122 B1 | 5/2005 | Ahn et al. |
| 6,921,702 B1 | 7/2005 | Ahn et al. |
| 6,958,302 B1 | 10/2005 | Ahn et al. |
| 2001/0002280 A1 | 5/2001 | Sneh |
| 2001/0030352 A1 | 10/2001 | Ruf et al. |
| 2002/0001971 A1 | 1/2002 | Cho |
| 2002/0068466 A1 | 6/2002 | Lee et al. |
| 2002/0089023 A1 | 7/2002 | Yu et al. .................... 257/411 |
| 2002/0094632 A1 | 7/2002 | Agarwal et al. |
| 2002/0111001 A1 | 8/2002 | Ahn |
| 2002/0155688 A1 | 10/2002 | Ahn |
| 2002/0155689 A1 | 10/2002 | Ahn |
| 2002/0192974 A1 | 12/2002 | Ahn et al. |
| 2002/0192975 A1 | 12/2002 | Ahn |
| 2002/0192979 A1 | 12/2002 | Ahn |
| 2003/0003702 A1 | 1/2003 | Ahn |
| 2003/0017717 A1 | 1/2003 | Ahn |
| 2003/0042526 A1 | 3/2003 | Weimer |
| 2003/0043637 A1 | 3/2003 | Forbes et al. |
| 2003/0045060 A1 | 3/2003 | Ahn |
| 2003/0045078 A1 | 3/2003 | Ahn et al. |
| 2003/0049942 A1 | 3/2003 | Haukka et al. |
| 2003/0052358 A1 | 3/2003 | Weimer |
| 2003/0059535 A1 | 3/2003 | Luo et al. |
| 2003/0104666 A1 | 6/2003 | Bojarczuk, Jr. et al. |
| 2003/0119246 A1 | 6/2003 | Ahn |
| 2003/0119291 A1 | 6/2003 | Ahn et al. |
| 2003/0132491 A1 | 7/2003 | Ahn |
| 2003/0157764 A1 | 8/2003 | Ahn et al. |
| 2003/0175411 A1 | 9/2003 | Kodas et al. ................. 427/58 |
| 2003/0193061 A1 | 10/2003 | Osten |
| 2003/0207032 A1 | 11/2003 | Ahn et al. |
| 2003/0207540 A1 | 11/2003 | Ahn et al. |
| 2003/0207593 A1 | 11/2003 | Derderian et al. |
| 2003/0227033 A1 | 12/2003 | Ahn et al. |
| 2003/0228747 A1 | 12/2003 | Ahn et al. |
| 2004/0007171 A1 | 1/2004 | Ritala et al. |
| 2004/0023461 A1 | 2/2004 | Ahn et al. |
| 2004/0033681 A1 | 2/2004 | Ahn et al. |
| 2004/0033701 A1 | 2/2004 | Ahn et al. |
| 2004/0038525 A1 | 2/2004 | Meng et al. |
| 2004/0038554 A1 | 2/2004 | Ahn |
| 2004/0043541 A1 | 3/2004 | Ahn |
| 2004/0043569 A1 | 3/2004 | Ahn |
| 2004/0043635 A1 | 3/2004 | Vaartstra |
| 2004/0075111 A1 | 4/2004 | Chidambarrao et al. |
| 2004/0110348 A1 | 6/2004 | Ahn et al. |
| 2004/0110391 A1 | 6/2004 | Ahn et al. |
| 2004/0144980 A1 | 7/2004 | Ahn et al. |
| 2004/0164357 A1 | 8/2004 | Ahn et al. |
| 2004/0164365 A1 | 8/2004 | Ahn et al. |
| 2004/0175882 A1 | 9/2004 | Ahn et al. |
| 2004/0183108 A1 | 9/2004 | Ahn |
| 2004/0214399 A1 | 10/2004 | Ahn et al. |
| 2004/0222476 A1 | 11/2004 | Ahn et al. |
| 2004/0233010 A1 | 11/2004 | Akram et al. |
| 2004/0262700 A1 | 12/2004 | Ahn et al. |
| 2005/0009370 A1 | 1/2005 | Ahn |
| 2005/0020017 A1 | 1/2005 | Ahn et al. |
| 2005/0023594 A1 | 2/2005 | Ahn et al. |
| 2005/0023624 A1 | 2/2005 | Ahn et al. |
| 2005/0023625 A1 | 2/2005 | Ahn et al. |
| 2005/0023626 A1 | 2/2005 | Ahn et al. |
| 2005/0023627 A1 | 2/2005 | Ahn et al. |
| 2005/0026349 A1 | 2/2005 | Forbes et al. |

| | | | |
|---|---|---|---|
| 2005/0026374 A1 | 2/2005 | Ahn et al. |
| 2005/0026458 A1 | 2/2005 | Basceri et al. |
| 2005/0029547 A1 | 2/2005 | Ahn et al. |
| 2005/0029604 A1 | 2/2005 | Ahn et al. |
| 2005/0029605 A1 | 2/2005 | Ahn et al. |
| 2005/0030825 A1 | 2/2005 | Ahn |
| 2005/0032292 A1 | 2/2005 | Ahn et al. |
| 2005/0032342 A1 | 2/2005 | Forbes et al. |
| 2005/0037563 A1 | 2/2005 | Ahn |
| 2005/0054165 A1 | 3/2005 | Ahn et al. |
| 2005/0077519 A1 | 4/2005 | Ahn et al. |
| 2005/0124174 A1 | 6/2005 | Ahn et al. |
| 2005/0227442 A1 | 10/2005 | Ahn et al. |

FOREIGN PATENT DOCUMENTS

| | | |
|---|---|---|
| JP | 2001-332546 | 11/2001 |

OTHER PUBLICATIONS

Ahn, Kie Y., et al., "ALD of Amorphous Lanthanide Doped TIOX Films", U.S. Appl. No. 11/092,072, filed Mar. 29, 2005.

Ahn, Kie Y., et al., "Atomic Layer Deposited Hafnium Tantalum Oxide Dielectrics", U.S. Appl. No. 11/029,757, filed Jan. 5, 2005.

Ahn, Kie Y., et al., "Atomic Layer Deposited Lanthanum Aluminum Oxide Dielectric Layer", U.S. Appl. No. 10/930,167, filed Aug. 31, 2004.

Ahn, Kie Y., et al., "Atomic Layer Deposited Lanthanum Hafnium Oxide Dielectrics", U.S. Appl. No. 11/010,529, filed Dec. 13, 2004.

Ahn, Kie Y., et al., "Atomic Layer Deposited Titanium Aluminum Oxide Films", U.S. Appl. No. 10/931,533, filed Aug. 31, 2004.

Ahn, Kie Y., et al., "Atomic Layer Deposition of Hf3N4/HfO2 Films as Gate Dielectrics", U.S. Appl. No. 11/063,717, filed Feb. 23, 2005.

Ahn, Kie Y., et al., "Atomic Layer Deposition of Zirconium-Doped Tantalum Oxide Films", U.S. Appl. No. 10/909,959, filed Aug. 2, 2004.

Ahn, Kie Y., et al., "Atomic Layer Deposition of Zr3N4/ZrO2 Films as Gate Dielectrics", U.S. Appl. No. 11/058,563, filed Feb. 15, 2005.

Ahn, Kie Y., et al., "Hybrid ALD-CVD of PrXOY/ZrO2 Films as Gate Dielectrics", U.S. Appl. No. 11/010,766, filed Dec. 13, 2004.

Ahn, Kie Y., et al., "Ruthenium Gate for a Lanthanide Oxide Dielectric Layer", U.S. Appl. No. 10/926,812, filed. Aug. 26, 2004.

Bright, A A., et al., "Low-rate plasma oxidation of Si in a dilute oxygen/helium plasma for low-temperature gate quality Si/Sio2 interfaces", *Applied Physics Letters*, 58(6), (Feb. 1991),619-621.

Bunshah, Rointan F., et al., "Deposition Technologies for Films and Coatings: Developments and Applications", Park Ridge, N.J., U.S.A. : *Noyes Publications*, (1982), 102-103.

Cheng, Baohong , et al., "The Impact of High-k Gate Dielectrics and Metal Gate Electrodes on Sub-100nm MOSFET's", *IEEE Transactions on Electron Devices*, 46(7), (Jul. 1999), 1537-1544.

Fuyuki, Takashi , et al., "Initial stage of ultra-thin SiO/sub 2/ formation at low temperatures using activated oxygen", *Applied Surface Science*, 117-118, (Jun. 1997),123-126.

Geller, S. , et al., "Crystallographic Studies of Perovskite-like Compounds. II. Rare Earth Aluminates", *Acta Cryst. vol. 9*, (May 1956),1019-1025.

Giess, E. A., "Lanthanide gallate perovskite-type substrates for epitaxial, high-T/sub c/ superconducting Ba/sub 2/YCu/sub 3/O/sub 7-delta / films", *IBM Journal of Research and Development*, 34(6), (Nov. 1990),916-926.

Hirayama, Masaki , et al., "Low-Temperature Growth of High-Integrity Silicon Oxide Films by Oxygen Radical Generated in High Density Krypton Plasma", *International Electron Devices Meeting 1999. Technical Digest*, (1999),249-252.

Hubbard, K. J., et al., "Thermodynamic stability of binary oxides in contact with silicon", *Journal of Materials Research*, 11(11), (Nov. 1996),2757-2776.

Jeon, Sanghun , et al., "Excellent electrical characteristics of lanthanide (Pr, Nd, Sm, Gd, and Dy) oxide and lanthanide-doped oxide for MOS gate dielectric applications", *Electron Devices Meeting,* 2001. IEDM Technical Digest. International , (2001),471-474.

Liu, C. T., "Circuit Requirement and Integration Challenges of Thin Gate Dielectrics for Ultra Small MOSFETs", *International Electron Devices Meeting 1998. Technical Digest*, (1998),747-750.

Liu, Y C., et al., "Growth of ultrathin SiO/sub 2/ on Si by surface irradiation with an O/sub 2/+Ar electron cyclotron resonance microwave plasma at low temperatures", *Journal of Applied Physics*, 85(3), (Feb. 1999),1911-1915.

Martin, P J., et al., "Ion-beam-assisted deposition of thin films", *Applied Optics*, 22(1), (Jan. 1983), 178-184.

Muller, D. A., "The Electronic Structure at the Atomic Scale of Ultrathin Gate Oxides", *Nature*, 399, (Jun. 1999),758-761.

Ohring, Milton , "The Materials Science of Thin Films", *Boston : Academic Press*, (1992),118,121,125.

Osten, H. J., et al., "High-k gate dielectrics with ultra-low leakage current based on praseodymium oxide", *International Electron Devices Meeting 2000. Technical Digest. IEDM*, (2000),653-656.

Park, Byung-Eun , et al., "Electrical properties of LaAlO3/Si and Sr0.8Bi2.2Ta2O9/LaAlO3/Si structures", *Applied Physics Letters*, 79(6), (Aug. 2001),806-808.

Qi, Wen-Jie , et al., "MOSCAP and MOSFET characteristics using ZrO2 gate dielectric deposited directly on Si", *Electron Devices Meeting, 1999. IEDM Technical Digest. International*, (1999), 145-148.

Saito, Yuji , et al., "Advantage of Radical Oxidation for Improving Reliability of Ultra-Thin Gate Oxide", *2000 Symposium on VLSI Technology Digest of Technical Papers*, (2000),176-177.

Saito, Yuji , et al., "High-Integrity Silicon Oxide Grown at Low-Temperature by Atomic Oxygen Generated in High-Density Krypton Plasma", *Extended Abstracts of the 1999 International Conference on Solid State Devices and Materials*, (1999),152-153.

Wilk, G. D., et al., "High-K gate dielectrics: Current status and materials properties considerations", *Journal of Applied Physics*, 89(10), (May 2001),5243-5275.

\* cited by examiner

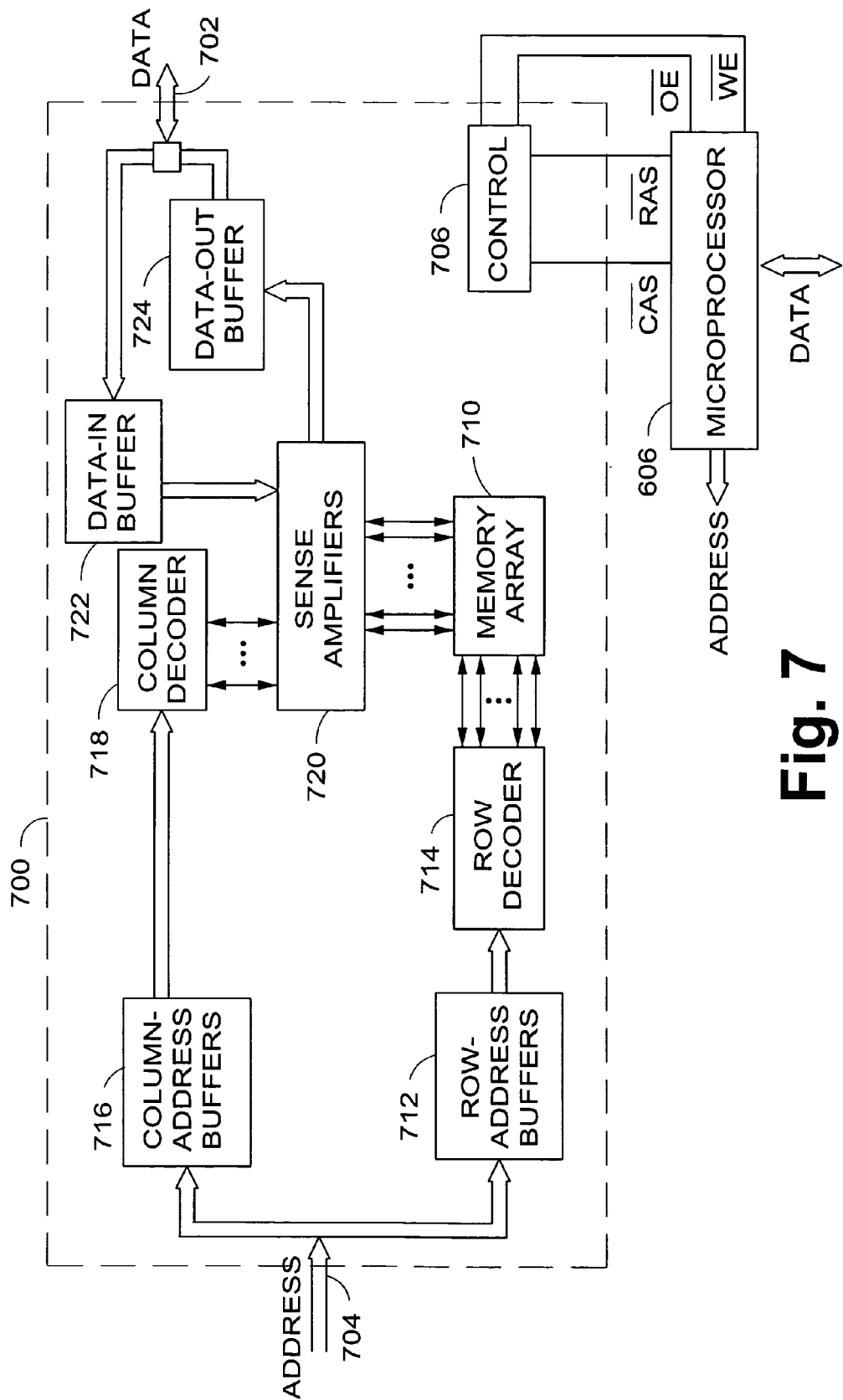

U.S. 7,064,058 B2

LOW-TEMPERATURE GROWTH HIGH-QUALITY ULTRA-THIN PRASEODYMIUM GATE DIELETRICS

RELATED APPLICATIONS

This application is a continuation of U.S. application Ser. No. 10/027,315 filed on Dec. 20, 2001, now U.S. Pat. No. 6,900,122, which is incorporated herein by reference.

FIELD OF THE INVENTION

The invention relates to semiconductor devices and device fabrication. Specifically, the invention relates to gate oxide layers of transistor devices and their method of fabrication.

BACKGROUND OF THE INVENTION

In the semiconductor device industry, particularly in the fabrication of transistors, there is continuous pressure to reduce the size of devices such as transistors. The ultimate goal is to fabricate increasingly smaller and more reliable integrated circuits (ICs) for use in products such as processor chips, mobile telephones, or memory devices such as DRAMs. The smaller devices are frequently powered by batteries, where there is also pressure to reduce the size of the batteries, and to extend the time between battery charges. This forces the industry to not only design smaller transistors, but to design them to operate reliably with lower power supplies.

A common configuration of a transistor is shown in FIG. 1. While the following discussion uses FIG. 1 to illustrate a transistor from the prior art, one skilled in the art will recognize that the present invention could be incorporated into the transistor shown in FIG. 1 to form a novel transistor according to the invention. The transistor 100 is fabricated in a substrate 110 that is typically silicon, but could be fabricated from other semiconductor materials as well. The transistor 100 has a first source/drain region 120 and a second source/drain region 130. A body region 132 is located between the first source/drain region and the second source/drain region, the body region 132 defining a channel of the transistor with a channel length 134. A gate dielectric, or gate oxide 140 is located on the body region 132 with a gate 150 located over the gate oxide. Although the gate dielectric can be formed from materials other than oxides, the gate dielectric is typically an oxide, and is commonly referred to as a gate oxide. The gate may be fabricated from polycrystalline silicon (polysilicon) or other conducting materials such as metal may be used.

In fabricating transistors to be smaller in size and reliably operating on lower power supplies, one important design criteria is the gate oxide 140. A gate oxide 140, when operating in a transistor, has both a physical gate oxide thickness and an equivalent oxide thickness (EOT). The equivalent oxide thickness quantifies the electrical properties, such as capacitance, of a gate oxide 140 in terms of a representative physical thickness. EOT is defined as the thickness of a theoretical $SiO_2$ layer that describes the actual electrical operating characteristics of the gate oxide 140 in the transistor 100. For example, in traditional $SiO_2$ gate oxides, a physical oxide thickness may be 5.0 nm, but due to undesirable electrical effects such as gate depletion, the EOT may be 6.0 nm. A gate oxide other than $SiO_2$ may also be described electrically in terms of an EOT. In this case, the theoretical oxide referred to in the EOT number is an equivalent $SiO_2$ oxide layer. For example, $SiO_2$ has a dielectric constant of approximately 4. An alternate oxide with a dielectric constant of 20 and a physical thickness of 100 nm would have an EOT of approximately 20 nm=(100*(4/20)), which represents a theoretical $SiO_2$ gate oxide.

Lower transistor operating voltages and smaller transistors require thinner equivalent oxide thicknesses (EOTs). A problem with the increasing pressure of smaller transistors and lower operating voltages is that gate oxides fabricated from $SiO_2$ are at their limit with regards to physical thickness and EOT. Attempts to fabricate $SiO_2$ gate oxides thinner than today's physical thicknesses show that these gate oxides no longer have acceptable electrical properties. As a result, the EOT of a $SiO_2$ gate oxide 140 can no longer be reduced by merely reducing the physical gate oxide thickness.

Attempts to solve this problem have led to interest in gate oxides made from oxide materials other than $SiO_2$. Certain alternate oxides have a higher dielectric constant (k), which allows the physical thickness of a gate oxide 140 to be the same as existing $SiO_2$ limits or thicker, but provides an EOT that is thinner than current $SiO_2$ limits.

A problem that arises in forming an alternate oxide layer on the body region of a transistor is the process in which the alternate oxide is formed on the body region. Recent studies show that the surface roughness of the body region has a large effect on the electrical properties of the gate oxide, and the resulting operating characteristics of the transistor. The leakage current through a physical 1.0 nm gate oxide increases by a factor of 10 for every 0.1 increase in the root-mean-square (RMS) roughness. In forming an alternate oxide layer on the body region of a transistor, a thin layer of the alternate material to be oxidized (typically a metal) must first be deposited on the body region. Current processes for depositing a metal or other alternate layer on the body region of a transistor are unacceptable due to their effect on the surface roughness of the body region.

FIG. 2A shows a surface 210 of a body region 200 of a transistor. The surface 210 in the Figure has a high degree of smoothness, with a surface variation 220. FIG. 2B shows the body region 200 during a conventional sputtering deposition process stage. During sputtering, particles 230 of the material to be deposited bombard the surface 210 at a high energy. When a particle 230 hits the surface 210, some particles adhere as shown by particle 235, and other particles cause damage as shown by pit 240. High energy impacts can throw off body region particles 215 to create the pits 240. A resulting layer 250 as deposited by sputtering is shown in FIG. 2C. The deposited layer/body region interface 255 is shown following a rough contour created by the sputtering damage. The surface of the deposited layer 260 also shows a rough contour due to the rough interface 255.

In a typical process of forming an alternate material gate oxide, the deposited layer 250 is oxidized to convert the layer 250 to an oxide material. Existing oxidation processes do not, however, repair the surface damage created by existing deposition methods such as sputtering. As described above, surface roughness has a large influence on the electrical properties of the gate oxide and the resulting transistor.

What is needed is an alternate material gate oxide that is more reliable at existing EOTs than current gate oxides. What is also needed is an alternate material gate oxide with an EOT thinner than conventional $SiO_2$. What is also needed is an alternative material gate oxide with a smooth interface between the gate oxide and the body region. Because existing methods of deposition are not capable of providing a smooth interface with an alternate material gate oxide, what is further needed is a method of forming an alternate material gate oxide that maintains a smooth interface.

Additionally, at higher process temperatures, any of several materials used to fabricate the transistor, such as silicon, can react with other materials such as metals or oxygen to form unwanted silicides or oxides. What is needed is a lower temperature process of forming gate oxides that prevents the formation of unwanted byproduct materials.

SUMMARY OF THE INVENTION

A method of forming a gate oxide on a surface such as a transistor body region is shown where a metal layer of praseodymium (Pr) is deposited by thermal evaporation on the body region. The Pr metal layer is then oxidized to convert the metal layer to a $Pr_2O_3$ gate oxide. One embodiment of the invention uses an electron beam source to evaporate the metal layer onto the body region of the transistor. The oxidation process in one embodiment utilizes a krypton(Kr)/oxygen ($O_2$) mixed plasma process.

In addition to the novel process of forming a $Pr_2O_3$ gate oxide layer, a transistor formed by the novel process exhibits novel features that may only be formed by the novel process. Thermal evaporation deposition of a metal layer onto a body region of a transistor preserves an original smooth surface roughness of the body region in contrast to other prior deposition methods that increase surface roughness. The resulting transistor fabricated with the process of this invention will exhibit a gate oxide/body region interface with a surface roughness variation as low as 0.6 nm.

Further, the $Pr_2O_3$ gate oxide can have a smaller EOT than a traditional $SiO_2$ gate oxide, and the process of forming the $Pr_2O_3$ gate oxide conserves the thermal budget while avoiding the formation of unwanted byproducts.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

FIG. 7 shows a schematic view of a DRAM memory device.

DETAILED DESCRIPTION OF THE PREFERRED EMBODIMENTS

Figure 1:
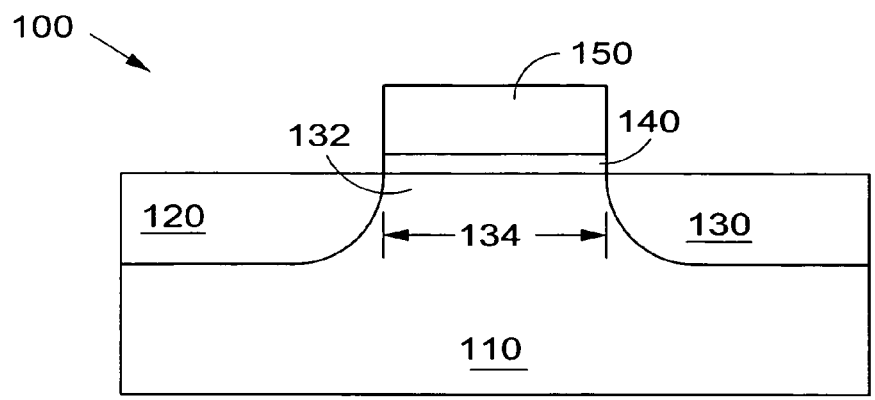
FIG. 1 shows a common configuration of a transistor.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator or dielectric is defined to include any material that is less electrically conductive than the materials referred to as conductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side"(as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Figure 3A:
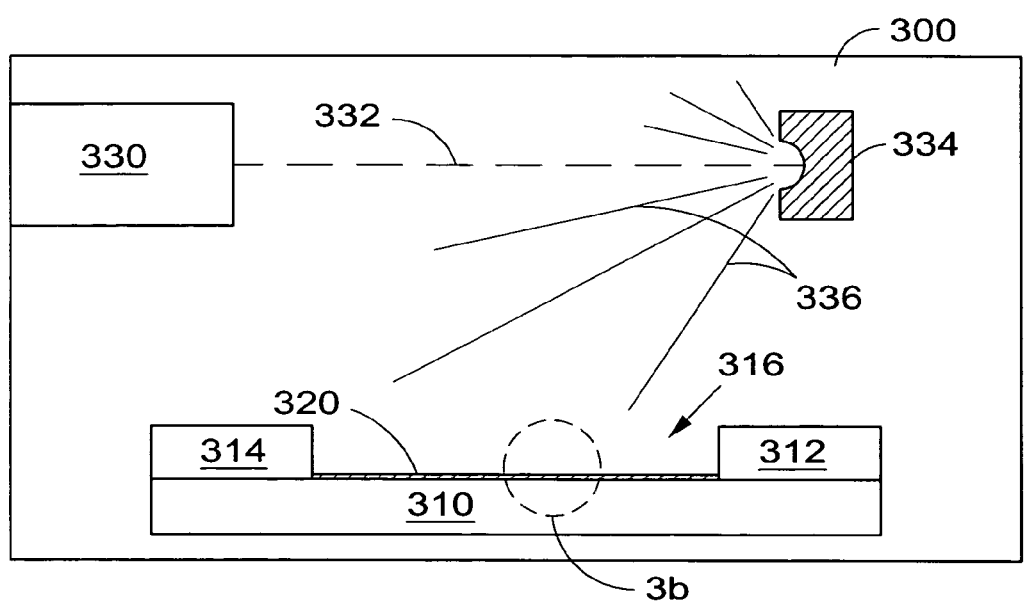
FIG. 3A shows a deposition process according to the invention.

FIG. 3A shows an example electron beam evaporation technique to deposit a material on a surface such as a body region of a transistor. In FIG. 3A, a substrate 310 is placed inside a deposition chamber 300. The substrate in this embodiment is masked by a first masking structure 312 and a second masking structure 314. In this embodiment, the unmasked region 316 includes a body region of a transistor, however one skilled in the art will recognize that other semiconductor device structures may utilize this process. Also located within the deposition chamber 300 is an electron beam source 330, and a target material 334. Although in this embodiment, an electron beam evaporation technique is used, it will be apparent to one skilled in the art that other thermal evaporation techniques and geometries can be used without departing from the scope of the invention. During the evaporation process, the electron beam source 330 generates an electron beam 332. The electron beam hits the target material 334 and heats a portion of the target material enough to cause the surface of the target material to evaporate. The evaporated material 336 is then distributed throughout the chamber 300, and the material 336 deposits on surfaces that it contacts, such as the exposed body region 316. The depositing material builds up to form a layer 320 of material that is chemically the same as the target material 334.

In one embodiment of the invention, the deposited material layer 320 includes a pure metal layer of praseodymium. (Pr). In one embodiment of the invention, the target material is a 99.9999% pure slug of Pr. The choice of Pr as the deposited material layer 320 is based on the favorable properties of $Pr_2O_3$ that can be formed. These favorable properties include the thermodynamic stability of the oxide with silicon, a small diffusion coefficient of the oxide at high processing temperatures such as 1000° C., the lattice match of the oxide with silicon, and a relatively high dielectric constant of 31, which is independent of the substrate dopant type. For a $Pr_2O_3$ film with an EOT of 14 Å, the leakage current density $J_g$ is an ultra-low $5\times10^{-9}$ A/cm$^2$ at $V_g$=+/−10 V, which is a least $10^4$ times lower than the best published values for $HfO_2$ or $ZrO_2$ films with the same EOT, and is the same as the leakage current of a 3 nm thick $SiO_2$ layer. No significant hysteresis is observed in capacitance-voltage (CV) measurements when the material is briefly annealed at 600° C. Dielectric breakdown of $Pr_2O_3$ occurs at above 43 MV/cm. Further, the oxide retains excellent current-voltage (IV) characteristics even after stress-induced electrical breakdown.

In one embodiment, the deposited Pr layer 320 is substantially amorphous. A lower presence of grain boundaries in the substantially amorphous Pr layer 320 reduces the leakage current through the final gate oxide. Although the amorphous form is preferred, the crystalline form is also acceptable.

Figure 2A:
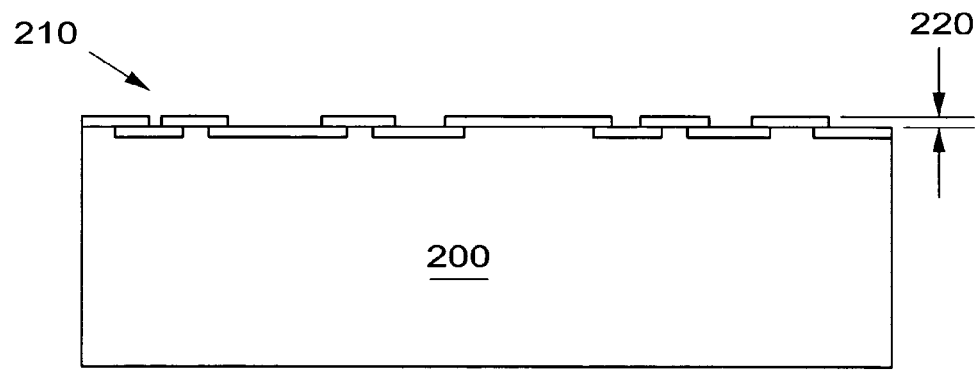
FIG. 2A shows a smooth surface of a body region of a transistor.
Figure 2B:
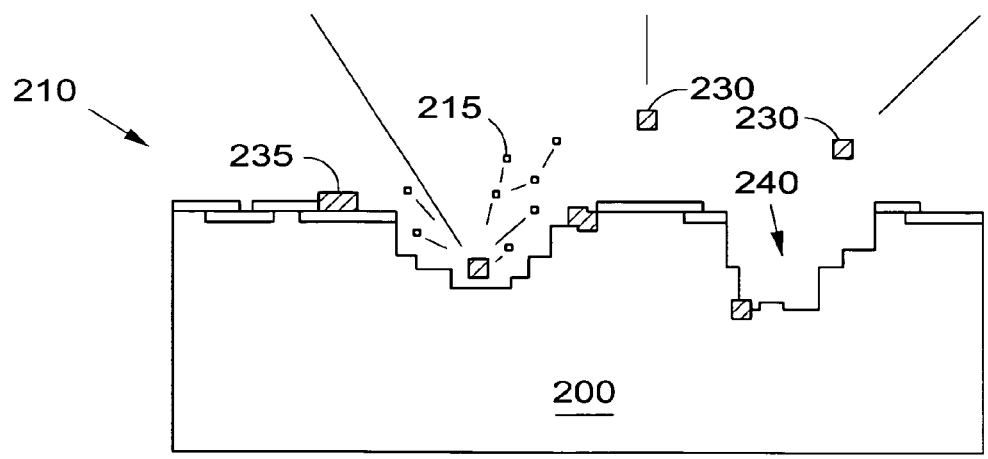
FIG. 2B shows a deposition process according to the prior art.
Figure 2C:
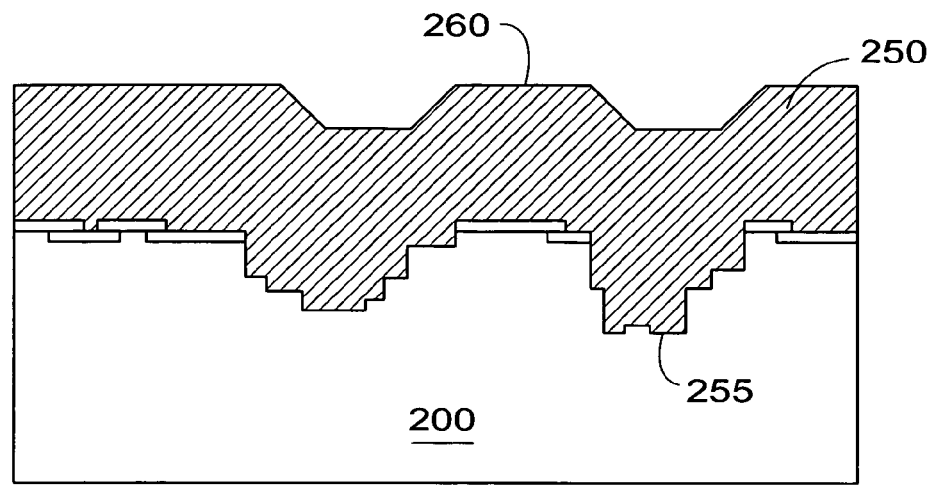
FIG. 2C shows a deposited film on a body region according to the prior art.

A thermal evaporation process such as the electron beam evaporation technique described above does not cause the surface damage that is inherent in other deposition techniques such as the sputtering technique shown in FIG. 2B. This allows a very thin layer of material to be deposited on a body region of a transistor, while maintaining a smooth interface. A thermal evaporation process such as the electron beam evaporation technique described above also allows low processing temperatures that inhibit the formation of unwanted byproducts such as silicides and oxides. In one embodiment, the thermal evaporation is performed with a substrate tempereature between approximately 150 and 400° C. In one embodiment, the thermal evaporation is performed with a substrate temperature between approximately 150 and 200° C.

Figure 3B:
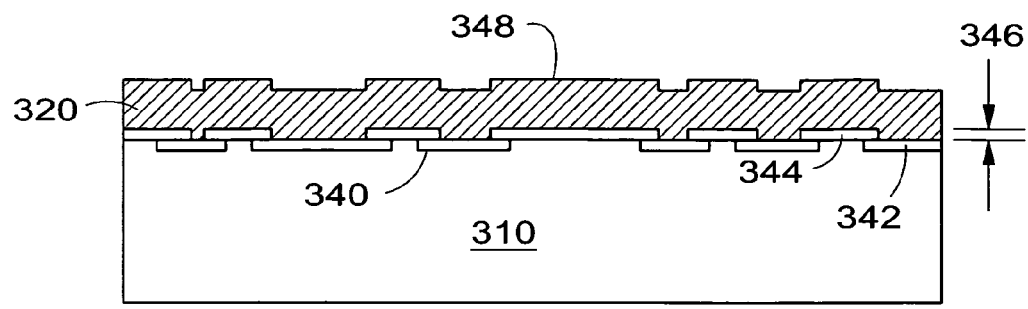
FIG. 3B shows a magnified view of a deposited film on a body region from FIG. 3A.

FIG. 3B shows a magnified view of the body region 316 and the deposited layer 320 from FIG. 3A The interface 340 is shown with a roughness variation 346. The deposited layer surface 348 is also shown with a similar surface roughness. One possible surface variation 346 would be an atomic layer variation. In atomic smoothness, the greatest difference in surface features is between a first atomic layer as indicated by layer 342 and a second atomic layer 344. The thermal evaporation deposition technique described above preserves atomic smoothness such as is shown in FIG. 3B. However, other acceptable levels of surface roughness greater than atomic smoothness will also be preserved by the thermal evaporation technique.

Figure 4A:
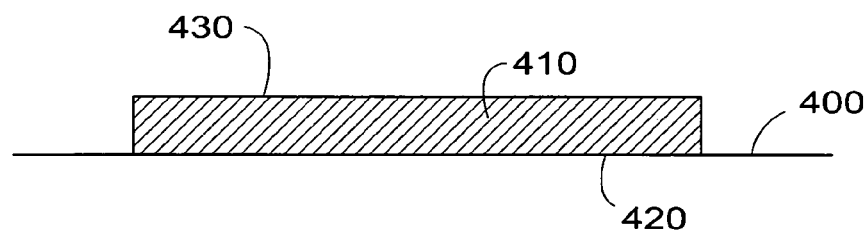
FIG. 4A shows a deposited film on a body region according to the invention.
Figure 4B:
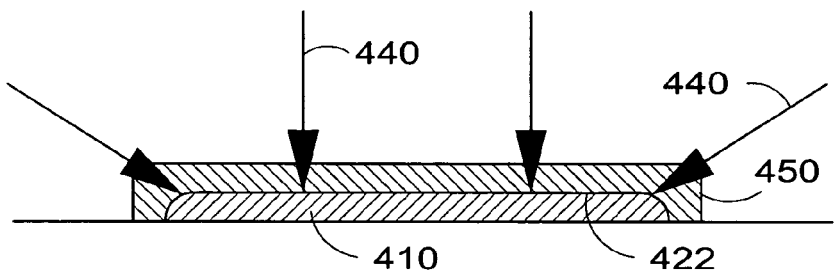
FIG. 4B shows a partially oxidized film on a body region according to the invention.
Figure 4C:
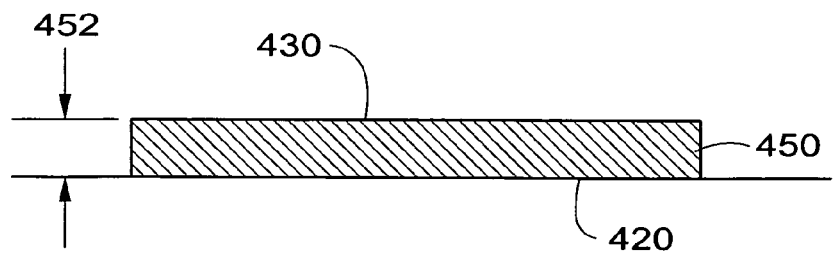
FIG. 4C shows a completely oxidized film on a body region according to the invention.

FIGS. 4A–4C show a low temperature oxidation process that is used in one embodiment to convert the deposited Pr layer 320 into a $Pr_2O_3$ gate oxide. A deposited material layer 410 of Pr is shown in FIG. 4A on a substrate surface 400. The layer 410 forms an interface 420 with the substrate surface 400, and the layer 410 has an outer surface 430. The layer 410 in this embodiment is deposited over a body region of a transistor, however the layer may be deposited on any surface within the scope of the invention.

In FIG. 4B, the layer 410 is in the process of being oxidized. In one embodiment, the oxidation process includes a krypton/oxygen mixed plasma oxidation process. The mixed plasma process generates atomic oxygen or oxygen radicals in contrast to molecular oxygen or 02 used in conventional thermal oxidation. The atomic oxygen is introduced to the layer from all exposed directions as indicated by arrows 440, creating an oxide portion 450. The atomic oxygen continues to react with the layer and creates an oxidation interface 422. As the reaction progresses, atomic oxygen diffuses through the oxide portion 450 and reacts at the oxidation interface 422 until the layer is completely converted to $Pr_2O_3$. FIG. 4C shows the resulting oxide layer 450, which spans a physical thickness 452 from the outer surface 430 to the interface 420.

In one embodiment, the processing variables for the mixed plasma oxidation include a low ion bombardment energy of less than 7 eV, a high plasma density above $10^{12}$/cm$^3$ and a low electron temperature below 1.3 eV. In one embodiment, the substrate temperature is approximately 400° C. In one embodiment, a mixed gas of 3% oxygen with the balance being krypton at a pressure of 1 Torr is used. In one embodiment, a microwave power density of 5 W/cm$^2$ is used. In one embodiment, the oxidation process provides a growth rate of 1.5 nm/min.

The low temperature mixed plasma oxidation process described above allows the deposited layer to be oxidized at a low temperature, which inhibits the formation of unwanted byproducts such as silicides and oxides. The mixed plasma process in one embodiment is performed at approximately 400° C. in contrast to prior thermal oxidation processes that are performed at approximately 1000° C. The mixed plasma oxidation process has also been shown to provide improved thickness variation on silicon (111) surfaces in addition to (100) surfaces. Although the low temperature mixed plasma process above describes the formation of alternate material oxides, one skilled in the art will recognize that the process can also be used to form $SiO_2$ oxide structures.

As mentioned above, $Pr_2O_3$ is thermodynamically stable and so reacts minimally with a silicon substrate or other structures during any later high temperature processing stages. $Pr_2O_3$ also exhibits a dielectric constant of approximately 31, which allows for a thinner EOT than conventional $SiO_2$. In addition to the stable thermodynamic properties inherent in $Pr_2O_3$, the novel process used to form the oxide layer is performed at lower temperatures than the prior art, which further inhibits reactions with the silicon substrate or other structures.

A transistor made using the novel gate oxide process described above will possess several novel features. By creating an oxide material with a higher dielectric constant (k) and controlling surface roughness during formation, a gate oxide can be formed with an EOT thinner than 2 nm. The smooth surface of the body region is preserved during processing, and a resulting transistor will have a smooth interface between the body region and the gate oxide with a surface roughness on the order of 0.6 nm.

Figure 5:
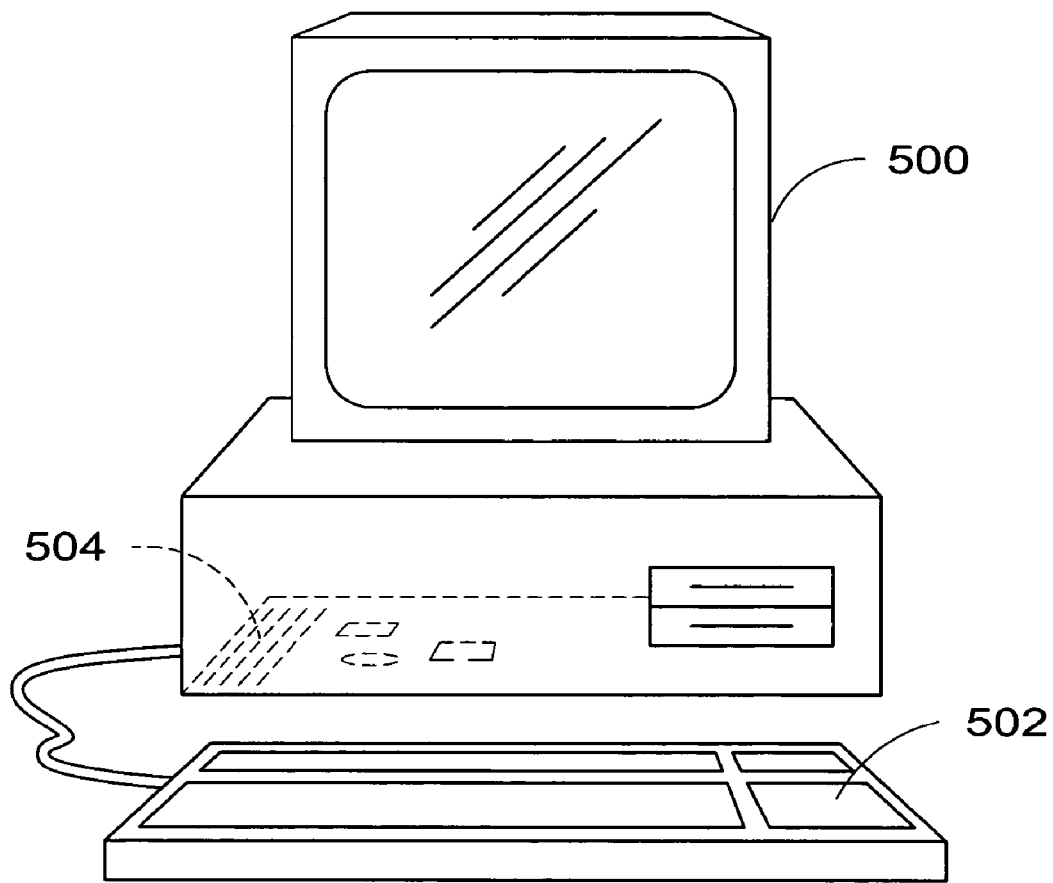
FIG. 5 shows a perspective view of a personal computer.
Figure 6:
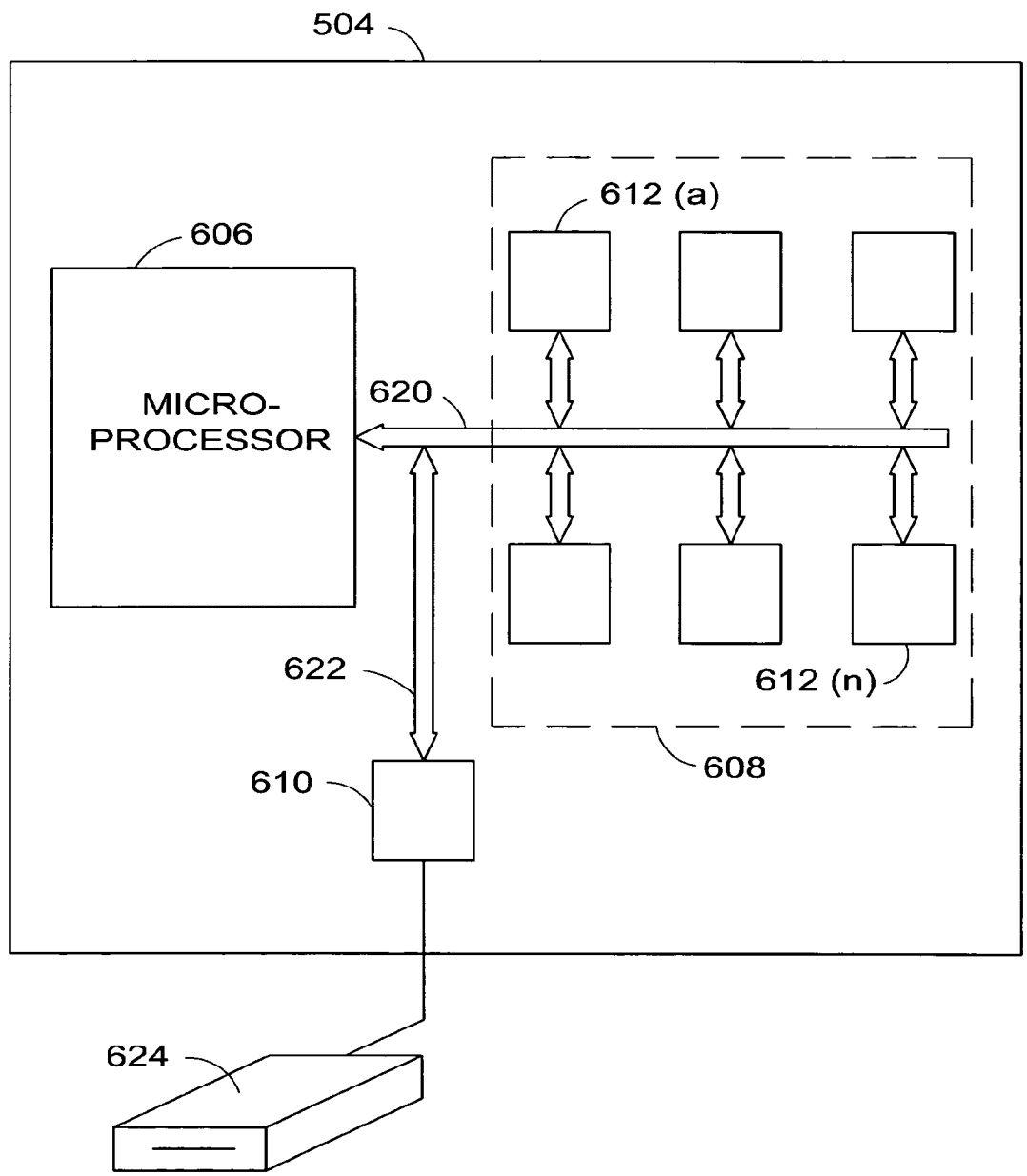
FIG. 6 shows a schematic view of a central processing unit.

Transistors created by the methods described above may be implemented into memory devices and information handling devices as shown in FIG. 5, FIG. 6 and FIG. 7, and described below. While specific types of memory devices and computing devices are shown below, it will be recognized by one skilled in the art that several types of memory devices and information handling devices could utilize the invention.

A personal computer, as shown in FIGS. 5 and 6, include a monitor 500, keyboard input 502 and a central processing unit 504. FIG. 6 illustrates in more detail typical components of the processor unit 504 shown in FIG. 5.

In FIG. 6, processor unit 604 typically includes microprocessor 606, memory bus circuit 608 having a plurality of memory slots 612(a–n), and other peripheral circuitry 610. Peripheral circuitry 610 permits various peripheral devices 624 to interface processor-memory bus 620 over input/output (I/O) bus 622. The personal computer shown in FIGS. 5 and 6 also includes at least one transistor having a gate oxide according to the teachings of the present invention.

Microprocessor 606 produces control and address signals to control the exchange of data between memory bus circuit 608 and microprocessor 606 and between memory bus circuit 608 and peripheral circuitry 610. This exchange of data is accomplished over high speed memory bus 620 and over high speed I/O bus 622.

Coupled to memory bus 620 are a plurality of memory slots 612(a–n) which receive memory devices well known to those skilled in the art. For example, single in-line memory modules (SIMMs) and dual in-line memory modules (DIMMs) may be used in the implementation of the present invention.

These memory devices can be produced in a variety of designs which provide different methods of reading from and writing to the dynamic memory cells of memory slots 612. One such method is the page mode operation. Page mode operations in a DRAM are defined by the method of accessing a row of a memory cell arrays and randomly accessing different columns of the array. Data stored at the row and column intersection can be read and output while that column is accessed. Page mode DRAMs require access steps which limit the communication speed of memory circuit 608. A typical communication speed for a DRAM device using page mode is approximately 33 MHZ.

An alternate type of device is the extended data output (EDO) memory which allows data stored at a memory array address to be available as output after the addressed column has been closed. This memory can increase some communication speeds by allowing shorter access signals without reducing the time in which memory output data is available on memory bus 620. Other alternative types of devices include SDRAM, DDR SDRAM, SLDRAM and Direct RDRAM as well as others such as SRAM or Flash memories.

FIG. 7 is a block diagram of an illustrative DRAM device 700 compatible with memory slots 612(a–n). The description of DRAM 700 has been simplified for purposes of illustrating a DRAM memory device and is not intended to be a complete description of all the features of a DRAM. Those skilled in the art will recognize that a wide variety of memory devices may be used in the implementation of the present invention. The example of a DRAM memory device shown in FIG. 7 includes at least one transistor having a gate oxide according to the teachings of the present invention.

Control, address and data information provided over memory bus 620 is further represented by individual inputs to DRAM 700, as shown in FIG. 7. These individual representations are illustrated by data lines 702, address lines 704 and various discrete lines directed to control logic 706.

As is well known in the art, DRAM 700 includes memory array 710 which in turn comprises rows and columns of addressable memory cells. Each memory cell in a row is coupled to a common wordline. Additionally, each memory cell in a column is coupled to a common bitline. Each cell in memory array 710 includes a storage capacitor and an access transistor as is conventional in the art.

DRAM 700 interfaces with, for example, microprocessor 606 through address lines 704 and data lines 702. Alternatively, DRAM 700 may interface with a DRAM controller, a micro-controller, a chip set or other electronic system. Microprocessor 606 also provides a number of control signals to DRAM 700, including but not limited to, row and column address strobe signals RAS and CAS, write enable signal WE, an output enable signal OE and other conventional control signals.

Row address buffer 712 and row decoder 714 receive and decode row addresses from row address signals provided on address lines 704 by microprocessor 606. Each unique row address corresponds to a row of cells in memory array 710. Row decoder 714 includes a wordline driver, an address decoder tree, and circuitry which translates a given row address received from row address buffers 712 and selectively activates the appropriate wordline of memory array 710 via the wordline drivers.

Column address buffer 716 and column decoder 718 receive and decode column address signals provided on address lines 704. Column decoder 718 also determines when a column is defective and the address of a replacement column. Column decoder 718 is coupled to sense amplifiers 720. Sense amplifiers 720 are coupled to complementary pairs of bitlines of memory array 710.

Sense amplifiers 720 are coupled to data-in buffer 722 and data-out buffer 724. Data-in buffers 722 and data-out buffers 724 are coupled to data lines 702. During a write operation, data lines 702 provide data to data-in buffer 722. Sense amplifier 720 receives data from data-in buffer 722 and stores the data in memory array 710 as a charge on a capacitor of a cell at an address specified on address lines 704.

During a read operation, DRAM 700 transfers data to microprocessor 606 from memory array 710. Complementary bitlines for the accessed cell are equilibrated during a precharge operation to a reference voltage provided by an equilibration circuit and a reference voltage supply. The charge stored in the accessed cell is then shared with the associated bitlines. A sense amplifier of sense amplifiers 720 detects and amplifies a difference in voltage between the complementary bitlines. The sense amplifier passes the amplified voltage to data-out buffer 724.

Control logic 706 is used to control the many available functions of DRAM 700. In addition, various control circuits and signals not detailed herein initiate and synchronize DRAM 700 operation as known to those skilled in the art. As stated above, the description of DRAM 700 has been simplified for purposes of illustrating the present invention and is not intended to be a complete description of all the features of a DRAM. Those skilled in the art will recognize that a wide variety of memory devices, including but not limited to, SDRAMs, SLDRAMs, RDRAMs and other DRAMs and SRAMs, VRAMs and EEPROMs, may be used in the implementation of the present invention.

The DRAM implementation described herein is illustrative only and not intended to be exclusive or limiting.

CONCLUSION

Thus has been shown a gate oxide and method of fabricating a gate oxide that produce a more reliable and thinner equivalent oxide thickness. The oxide $Pr_2O_3$ formed from Pr is thermodynamically stable so that the gate oxide will react minimally with a silicon substrate or other structures during any later high temperature processing stages.

$Pr_2O_3$ has been shown to provide excellent electrical and thermodynamic properties. In addition to the stable thermodynamic properties inherent in $Pr_2O_3$, the process shown is performed at lower temperatures than the prior art, which further inhibits reactions with the silicon substrate or other structures.

Transistors and higher level ICs or devices have been shown utilizing the novel gate oxide and process of formation. The higher dielectric constant (k) oxide materials shown in one embodiment are formed with an EOT thinner than 2 nm, e.g. thinner than possible with conventional $SiO_2$ gate oxides. A thicker gate oxide that is more uniform, and easier to process has also been shown with at EOT equivalent to the current limits of $SiO_2$ gate oxides.

A novel process of forming $Pr_2O_3$ gate oxide of has been shown where the surface smoothness of the body region is preserved during processing, and the resulting transistor has a smooth interface between the body region and the gate oxide with a surface roughness on the order of 0.6 nm. This solves the prior art problem of poor electrical properties such as high leakage current, created by unacceptable surface roughness.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A method comprising:
   thermal evaporation depositing a praseodymium (Pr) layer on a surface on a substrate; and
   oxidizing the Pr layer to form an oxide on the surface, the oxide including a praseodymium oxide layer, wherein thermal evaporation depositing the Pr layer and oxidizing the Pr layer are performed at substrate temperatures that inhibit formation of unwanted silicides and oxides.

2. The method of claim 1, wherein thermal evaporation depositing the Pr layer includes thermal evaporation depositing by electron beam evaporation to form the Pr layer as an amorphous Pr layer.

3. The method of claim 2, wherein electron beam evaporation depositing the Pr layer includes electron beam evaporating a 99.9999% pure Pr target.

4. The method of claim 1, wherein thermal evaporation depositing the Pr layer includes thermal evaporation depositing at an approximate substrate temperature range of 150–400° C.

5. The method of claim 1, wherein oxidizing the Pr layer includes oxidizing at a substrate temperature of approximately 400° C.

6. The method of claim 1, wherein oxidizing the Pr layer includes oxidizing with atomic oxygen.

7. The method of claim 1, wherein oxidizing the Pr layer includes oxidizing using a krypton (Kr)/oxygen ($O_2$) mixed plasma process having a plasma density above $10^{12}/cm^3$.

8. The method of claim 1, wherein the method includes forming the oxide layer to have an equivalent oxide thickness (EOT) of less than 2 nm.

9. A method comprising:
   thermal evaporation depositing a praseodymium (Pr) layer on a surface on a substrate, the substrate having a substrate temperature ranging from about 150° C. to about 400° C.; and
   oxidizing the Pr layer using a krypton (Kr)/oxygen ($O_2$) mixed plasma process to form an oxide on the surface, the oxide including a $Pr_2O_3$ layer, wherein thermal evaporation depositing the Pr layer and oxidizing the Pr layer are performed at substrate temperatures that inhibit formation of unwanted silicides and oxides.

10. The method of claim 9, wherein thermal evaporation depositing the metal layer includes thermal evaporation depositing by electron beam evaporation.

11. The method of claim 10, wherein oxidizing the Pr layer using a krypton (Kr)/oxygen ($O_2$) mixed plasma process includes oxidizing the Pr layer using a krypton (Kr)/oxygen ($O_2$) mixed plasma process at an electron temperature below 1.3 eV.

12. The method of claim 9, wherein the method further includes conducting the $Kr/O_2$ mixed plasma process using a microwave power density of about 5 W/cm.

13. The method of claim 9, wherein thermal evaporation depositing a praseodymium (Pr) layer on the surface is conducted at a substrate temperature ranging from about 150° C. to about 200° C.

14. The method of claim 9, wherein the method further includes annealing the $Pr_2O_3$ layer such that the $Pr_2O_3$ layer is amorphous after annealing.

15. The method of claim 9, wherein the method further includes oxidizing the Pr layer to form the $Pr_2O_3$ layer at a growth rate of about 1.5 nm/mm.

16. The method of claim 9, wherein oxidizing the Pr layer by a krypton (Kr)/oxygen ($O_2$) mixed plasma process includes using an ion bombardment energy less than 7eV.

17. The method of claim 9, wherein oxidizing the Pr layer by a krypton (Kr)/oxygen ($O_2$) mixed plasma process includes using a krypton (Kr)/oxygen ($O_2$) mixed gas that is about 3% oxygen.

18. The method of claim 9, wherein the method further includes forming the oxide on a silicon body region.

19. A method comprising:
   electron beam evaporation depositing a praseodymium (Pr) layer on a surface on a substrate, the substrate having a substrate temperature ranging from about 150° C. to about 400° C.; and
   oxidizing the Pr layer to form an oxide on the surface using an oxidation process that generates atomic oxygen or oxygen radicals without substantially generating molecular oxygen, the oxide including a praseodymium oxide layer, wherein electron beam evaporation depositing the Pr layer and oxidizing the Pr layer are performed at substrate temperatures that inhibit formation of unwanted silicides and oxides.

20. The method of claim 19, wherein the method includes oxidizing the Pr layer to form the oxide layer to have an equivalent oxide thickness (EOT) of 2 nm or less.

21. The method of claim 19, wherein the method includes annealing the praseodymium oxide layer at 600° C.

22. The method of claim 19, wherein the method further includes annealing the praseodymium oxide layer such that the praseodymium oxide layer is amorphous after annealing.

23. The method of claim 19, wherein oxidizing the Pr layer to form an oxide includes forming the oxide such that an interface between the surface and the oxide has a surface roughness on the order of 6 nanometers.

24. A method of forming a transistor, comprising:
    forming first and second source/drain regions on a substrate;
    forming a transistor body region between the first and second source/drain regions;
    thermal evaporation depositing a praseodymium (Pr) layer on the transistor body region;
    oxidizing the Pr layer to form a gate oxide on the transistor body region, the gate oxide including a praseodymium oxide layer, wherein thermal evaporation depositing the Pr layer and oxidizing the Pr layer are performed at substrate temperatures that inhibit formation of unwanted silicides and oxides; and
    coupling a gate to the gate oxide.

25. The method of claim 24, wherein oxidizing the Pr layer includes using an oxidation process that generates atomic oxygen or oxygen radicals without substantially generating molecular oxygen.

26. The method of claim 24, wherein oxidizing the Pr layer to form a gate oxide includes forming the gate oxide such that an interface between the transistor body region and the gate oxide has a surface roughness on the order of 6 nanometers.

27. The method of claim 24, wherein oxidizing the Pr layer includes using a krypton (Kr)/oxygen ($O_2$) mixed plasma process with an ion bombardment energy less than 7eV at an electron temperature below 1.3eV.

28. The method of claim 24, wherein oxidizing the Pr layer to form a gate oxide includes forming the gate oxide with an equivalent oxide thickness (EOT) of 2 nm or less.

29. A method of forming a transistor, comprising:
    forming first and second source/drain regions on a substrate;
    forming a transistor body region between the first and second source/drain regions;
    electron beam evaporation depositing a praseodymium (Pr) layer on the transistor body region, the substrate having a substrate temperature ranging from about 150° C. to about 400° C.;
    oxidizing the Pr layer using a krypton (Kr)/oxygen ($O_2$) mixed plasma process to form a gate oxide on the transistor body region, the gate oxide including a $Pr_2O_3$ layer, wherein electron beam evaporation depositing the Pr layer and oxidizing the Pr layer are performed at substrate temperatures that inhibit formation of unwanted silicides and oxides; and
    coupling a gate to the gate oxide.

30. The method of claim 29, wherein oxidizing the Pr layer to form a gate oxide includes forming the gate oxide such that an interface between the transistor body region and the gate oxide has a surface roughness on the order of 6 nanometers.

31. The method of claim 29, wherein electron beam evaporation depositing the Pr layer includes electron beam evaporation depositing at an approximate substrate temperature range of 150–200° C.

32. The method of claim 29, wherein oxidizing the Pr layer includes oxidizing at a substrate temperature of approximately 400° C.

33. The method of claim 29, wherein oxidizing the Pr layer using a krypton (Kr)/oxygen ($O_2$) mixed plasma process to form a gate oxide includes forming the gate oxide with an equivalent oxide thickness (EOT) of 2nm or less.

34. The method of claim 29, wherein using a krypton (Kr)/oxygen ($O_2$) mixed plasma process includes using a krypton (Kr)/oxygen ($O_2$) mixed plasma having a plasma density above $10^{12}/cm^3$.

35. The method of claim 29, wherein using a krypton (Kr)/oxygen ($O_2$) mixed plasma process includes using a krypton (Kr)/oxygen ($O_2$) mixed gas that is about 3% oxygen and using an ion bombardment energy less than 7eV.

36. A method of forming a memory, comprising:
    forming a number of access transistors including:
        forming first and second source/drain regions on a substrate;
        forming a transistor body region between the first and second source/drain regions;
        thermal evaporation depositing a praseodymium (Pr) layer on the transistor body region;
        oxidizing the Pr layer to form a gate oxide including a praseodymium oxide layer on the transistor body region, wherein thermal evaporation depositing the Pr layer and oxidizing the Pr layer are performed at substrate temperatures that inhibit formation of unwanted silicides and oxides; and
        coupling a gate to the oxide layer;
    forming a number of wordlines coupled to a number of the gates of the number of access transistors;
    forming a number of sourcelines coupled to a number of the first source/drain regions of the number of access transistors; and
    forming a number of bitlines coupled to a number of the second source/drain regions of the number of access transistors.

37. The method of claim 36, wherein oxidizing the Pr layer to form a gate oxide includes forming the gate oxide such that an interface between the transistor body region and the gate oxide has a surface roughness on the order of 6 nanometers.

38. The method of claim 36, wherein thermal evaporation depositing the Pr layer includes thermal evaporation depositing by electron beam evaporation to form the Pr layer as an amorphous Pr layer.

39. The method of claim 38, wherein electron beam evaporation depositing the Pr layer includes electron beam evaporating a 99.9999% pure Pr target.

40. The method of claim 36, wherein thermal evaporation depositing the Pr layer includes thermal evaporation depositing at an approximate substrate temperature range of 150–400° C.

41. The method of claim 40, wherein oxidizing the Pr layer includes oxidizing at a substrate temperature of approximately 400° C.

42. The method of claim 36, wherein oxidizing the Pr layer includes oxidizing with atomic oxygen or oxygen radicals without substantially oxidizing with molecular oxygen.

43. The method of claim 36, wherein oxidizing the Pr layer includes oxidizing using a krypton (Kr)/oxygen ($O_2$) mixed plasma process using a krypton (Kr)/oxygen ($O_2$) mixed gas that is about 3% oxygen having a plasma density above $10^2/cm^3$ and using an ion bombardment energy less than 7eV.

44. The method of claim 36, wherein forming the memory includes forming a dynamic random access memory.

45. A method of forming a memory, comprising:
forming a number of access transistors including:
  forming first and second source/drain regions on a substrate;
  forming a transistor body region between the first and second source/drain regions;
  thermal evaporation depositing a praseodymium (Pr) layer on the transistor body region, the substrate having a substrate temperature ranging from about 150° C. to about 400° C.;
  oxidizing the Pr layer using a krypton (Kr)/oxygen ($O_2$) mixed plasma process to form a gate oxide including a layer of $Pr_2O_3$ the transistor body region, wherein thermal evaporation depositing the Pr layer and oxidizing the Pr layer are performed at substrate temperatures that inhibit formation of unwanted silicides and oxides; and
  coupling a gate to the oxide layer;
forming a number of wordlines coupled to a number of the gates of the number of access transistors;
forming a number of sourcelines coupled to a number of the first source/drain regions of the number of access transistors; and
forming a number of bitlines coupled to a number of the second source/drain regions of the number of access transistors.

46. The method of claim 45, wherein oxidizing the Pr layer to form a gate oxide includes forming the gate oxide such that an interface between the transistor body region and the gate oxide has a surface roughness on the order of 6 nanometers.

47. The method of claim 45, wherein thermal evaporation depositing the Pr layer includes electron beam evaporation depositing at an approximate substrate temperature range of 150–200° C. and oxidizing the Pr layer includes oxidizing at a substrate temperature of approximately 400° C.

48. The method of claim 45, wherein oxidizing the Pr layer using a krypton (Kr)/oxygen ($O_2$) mixed plasma process to form a gate oxide includes forming the gate oxide with an equivalent oxide thickness (EOT) of 2 nm or less.

49. The method of claim 45, wherein using a krypton (Kr)/oxygen ($O_2$) mixed plasma process includes using a krypton (Kr)/oxygen ($O_2$) mixed plasma having a plasma density above $10^{12}/cm^3$.

50. The method of claim 45, wherein using a krypton (Kr)/oxygen ($O_2$) mixed plasma process includes using a krypton (Kr)/oxygen ($O_2$) mixed gas that is about 3% oxygen and using an ion bombardment energy less than 7eV.

51. The method of claim 45, wherein forming the memory includes forming a flash memory.

52. A method of forming an information handling system, comprising:
providing a processor; and
coupling the processor to a memory using a system bus, the memory formed by a method including:
  forming a number of access transistors, including:
    forming first and second source/drain regions on a substrate;
    forming a transistor body region between the first and second source/drain regions;
    thermal evaporation depositing a praseodymium (Pr) layer on the transistor body region;
    oxidizing the Pr layer to form a gate oxide including a praseodymium oxide layer on the transistor body region, wherein thermal evaporation depositing the Pr layer and oxidizing the Pr layer are performed at substrate temperatures that inhibit formation of unwanted silicides and oxides; and
    coupling a gate to the gate oxide;
  forming a number of wordlines coupled to a number of the gates of the number of access transistors;
  forming a number of sourcelines coupled to a number of the first source/drain regions of the number of access transistors; and
  forming a number of bitlines coupled to a number of the second source/drain regions of the number of access transistors.

53. The method of claim 52, wherein thermal evaporation depositing the Pr layer includes thermal evaporation depositing by electron beam evaporation to form the Pr layer as an amorphous Pr layer.

54. The method of claim 53, wherein electron beam evaporation depositing the Pr layer includes electron beam evaporation of a 99.9999% pure Pr target.

55. The method of claim 52, wherein thermal evaporation depositing the Pr layer includes thermal evaporation depositing at an approximate substrate temperature range of 150–400° C.

56. The method of claim 52, wherein oxidizing the Pr layer includes oxidizing at a substrate temperature of approximately 400° C.

57. The method of claim 52, wherein oxidizing the Pr layer includes oxidizing with atomic oxygen or oxygen radicals without substantially oxidizing with molecular oxygen.

58. The method of claim 52, wherein oxidizing the Pr layer includes oxidizing using a krypton (Kr)/oxygen ($O_2$) mixed plasma process using a krypton (Kr)/oxygen ($O_2$) mixed gas that is about 3% oxygen, having a plasma density above $10^{12}/cm^3$, and using an ion bombardment energy less than 7eV.

59. The method of claim 52, wherein forming the information handling system includes forming a computer.

60. A method of forming an information handling system, comprising:
providing a processor; and
coupling the processor to a memory using a system bus, the memory formed by a method including:
  forming a number of access transistors, including:
    forming first and second source/drain regions on a substrate;
    forming a transistor body region between the first and second source/drain regions;
    thermal evaporation depositing a praseodymium (Pr) layer on the transistor body region, the substrate having a substrate temperature ranging from about 150° C. to about 400° C.; oxidizing the Pr layer using a krypton (Kr)/oxygen ($O_2$) mixed plasma process to form a gate oxide including a layer of $Pr_2O_3$ on the transistor body region, wherein thermal evaporation depositing the Pr layer and oxidizing the Pr layer are performed at substrate temperatures that inhibit formation of unwanted silicides and oxides; and
    coupling a gate to the gate oxide;
  forming a number of wordlines coupled to a number of the gates of the number of access transistors;
  forming a number of sourcelines coupled to a number of the first source/drain regions of the number of access transistors; and forming a number of bitlines coupled to a number of the second source/drain regions of the number of access transistors.

61. The method of claim 60, wherein electron beam evaporation depositing the Pr layer includes electron beam evaporation depositing at an approximate substrate temperature range of 150–200° C. and oxidizing the Pr layer includes oxidizing at a substrate temperature of approximately 400° C.

62. The method of claim 60, wherein oxidizing the Pr layer using a krypton (Kr)/oxygen ($O_2$) mixed plasma process to form a gate oxide includes forming the gate oxide with an equivalent oxide thickness (EOT) of 2 nm or less.

63. The method of claim 60, wherein using a krypton (Kr)/oxygen ($O_2$) mixed plasma process includes using a krypton (Kr)/oxygen ($O_2$) mixed plasma having a plasma density above $10^{12}/cm^3$.

64. The method of claim 60, wherein using a krypton (Kr)/oxygen ($O_2$) mixed plasma process includes using a krypton (Kr)/oxygen ($O_2$) mixed gas that is about 3% oxygen and using an ion bombardment energy less than 7eV.

65. The method of claim 60, wherein forming the information handling system includes forming a computer.

* * * * *

UNITED STATES PATENT AND TRADEMARK OFFICE
CERTIFICATE OF CORRECTION

PATENT NO. : 7,064,058 B2
APPLICATION NO. : 10/768597
DATED : June 20, 2006
INVENTOR(S) : Ahn et al.

It is certified that error appears in the above-identified patent and that said Letters Patent is hereby corrected as shown below:

On Title Page, in field (54), in "Title", in column 1, line 1, delete "GROWTH" and insert - - GROWN - -, therefor.

On Title Page, in field (54), in "Title", in column 1, line 3, delete "DIELETRICS" and insert - - DIELECTRICS - -, therefor.

On Title Page, in field (56), under "U.S. Patent Documents", in column 2, line 19, delete "Ahn" and insert - - Ahn et al. ……….. 438/592 - -, therefor.

On Title Page, in field (56), under "U.S. Patent Documents", in column 2, line 20, delete "Ahn" and insert - - Ahn et al. ……….. 29/76 - -, therefor.

On Title Page, in field (56), under "U.S. Patent Documents", in column 2, line 25, delete "Ahn" and insert - - Ahn et al. ……….. 438/768 - -, therefor.

On Title Page, page 3 in field (56), under "Foreign Patent Documents", in column 1, line 1, after "11/2001" insert - - H01L 21/316 - -.

In column 1, line 1, delete "GROWTH" and insert - - GROWN - -, therefor.

In column 1, line 3, delete "DIELETRICS" and insert - - DIELECTRICS - -, therefor.

In column 10, line 39, in Claim 15, delete "nm/mm." and insert - - nm/min. - -, therefor.

In column 12, line 64, in Claim 43, delete "$10^2/cm^3$" and insert - - $10^{12}/cm^3$ - -, therefor.

UNITED STATES PATENT AND TRADEMARK OFFICE
CERTIFICATE OF CORRECTION

PATENT NO. : 7,064,058 B2
APPLICATION NO. : 10/768597
DATED : June 20, 2006
INVENTOR(S) : Ahn et al.

It is certified that error appears in the above-identified patent and that said Letters Patent is hereby corrected as shown below:

In column 13, line 13, in Claim 45, after "$Pr_2O_3$" insert - - on - -.

Signed and Sealed this

Fifth Day of September, 2006

JON W. DUDAS
*Director of the United States Patent and Trademark Office*